United States Patent
Van Arendonk et al.

(10) Patent No.: US 6,930,499 B2
(45) Date of Patent: Aug. 16, 2005

(54) METHOD OF MANUFACTURING AN INTEGRATED CIRCUIT, INTEGRATED CIRCUIT OBTAINED IN ACCORDANCE WITH SAID METHOD, WAFER PROVIDED WITH AN INTEGRATED CIRCUIT OBTAINED IN ACCORDANCE WITH THE METHOD, AND SYSTEM COMPRISING AN INTEGRATED CIRCUIT OBTAINED BY MEANS OF THE METHOD

(75) Inventors: Anton Petrus Maria Van Arendonk, Eindhoven (NL); Edwin Roks, Eindhoven (NL); Adrianus Johannes Mierop, Eindhoven (NL)

(73) Assignee: Koninklijke Philip Electronics N.V., Eindhoven (NL)

( * ) Notice: Subject to any disclaimer, the term of this patent is extended or adjusted under 35 U.S.C. 154(b) by 129 days.

(21) Appl. No.: 10/253,235

(22) Filed: Sep. 24, 2002

(65) Prior Publication Data

US 2003/0075741 A1 Apr. 24, 2003

(30) Foreign Application Priority Data

Sep. 28, 2001 (EP) .............................................. 01203704

(51) Int. Cl.$^7$ ................................................ G01R 31/02
(52) U.S. Cl. .................... 324/763; 324/765; 324/158.1
(58) Field of Search ............................... 324/73.1, 754, 324/763–765, 158.1; 438/17–18; 365/189.05, 201, 230.08

(56) References Cited

U.S. PATENT DOCUMENTS 3,849,872 A * 11/1974 Hubacher .................... 438/17
5,053,700 A 10/1991 Parrish ...................... 324/158.1
5,059,899 A * 10/1991 Farnworth et al. ............ 438/18
5,442,282 A * 8/1995 Rostoker et al. .......... 324/158.1
5,446,395 A * 8/1995 Goto .......................... 324/763
5,557,573 A * 9/1996 McClure ..................... 365/201
5,808,947 A 9/1998 McClure ..................... 365/201

* cited by examiner

Primary Examiner—Minh N. Tang
(74) Attorney, Agent, or Firm—Aaron Waxler

(57) ABSTRACT

The invention relates to a method of manufacturing an integrated circuit (404) on a die (402), wherein the die (402) forms a detachable part of a wafer (401) comprising a plurality of dies that are separated from each other by dicing lanes (403). The method comprises a step of applying a metallization pattern (407) in at least one of the dicing lanes (403) to form a communication bus comprising at least one communication bus circuit (405) that is part of the integrated circuit (404). Said step is followed by a step wherein the integrated circuit (404) is tested according to a predetermined testing method which uses the communication bus circuit (405) to communicate with the integrated circuit (404). This step is followed by a next step wherein the die (402) is detached from the wafer (401). The communication bus circuit (405) is designed so as to communicate in a wafer test mode as well as in a functional mode. During the testing of the integrated circuit (404), it communicates in the wafer test mode. The invention also relates to an integrated circuit (404) obtained by means of the manufacturing method, a wafer (401) comprising an integrated circuit (404) obtained by means of the manufacturing method, and a system comprising an integrated circuit (404) obtained by means of the manufacturing method.

15 Claims, 10 Drawing Sheets

METHOD OF MANUFACTURING AN INTEGRATED CIRCUIT, INTEGRATED CIRCUIT OBTAINED IN ACCORDANCE WITH SAID METHOD, WAFER PROVIDED WITH AN INTEGRATED CIRCUIT OBTAINED IN ACCORDANCE WITH THE METHOD, AND SYSTEM COMPRISING AN INTEGRATED CIRCUIT OBTAINED BY MEANS OF THE METHOD

The invention relates to a method of manufacturing an integrated circuit on a die that is formed as a detachable part of a wafer, which method comprises a step of providing a metallization pattern in at least one dicing lane so as to form a communication bus comprising at least one communication bus circuit that forms part of the integrated circuit, which step is followed by a step wherein the integrated circuit is tested in accordance with a predetermined test method that utilizes the communication bus circuit for communication with the integrated circuit, after which a step is carried out wherein the die is detached from the wafer.

The invention also relates to an integrated circuit provided with a communication bus circuit and situated on a die, which die was a detachable part of a wafer during the manufacture of the integrated circuit, and the wafer comprised a number of dies that were separated from each other by means of dicing lanes, and a metallization pattern for forming a communication bus comprising the communication bus circuit was formed in at least one of the dicing lanes.

The invention also relates to a wafer for use in the method in accordance with the invention, comprising dies on at least one of which an integrated circuit is realized, and further comprising at least one dicing lane provided with a metallization pattern.

The invention further relates to a system comprising a first and a second integrated circuit, which are both provided with a communication bus circuit which are interconnected so as to form a communication bus.

Such a method is known from U.S. Pat. No. 5,808,947.

The manufacture of integrated circuits is a complicated process which, broadly speaking, can be divided into two parts. In the first part slices of semiconductor material, for example silicon, that are used as the starting material are subjected to a large number of steps wherein, for example, ions are implanted, diffusions are carried out, and metallization is provided that is partly etched away again so as to form interconnections between different devices. After said first part of the production process has been carried out, the wafer is provided with dies on which the integrated circuits are formed. The spaces between the dies are customarily referred to as dicing lanes. In the second part of the production process, the wafer on which the dies are formed undergo a large number of additional steps wherein, for example, the dies are detached from the wafer along said dicing lanes, the dies are placed in a housing, electroconductive connections between the I/O terminals of the integrated circuits, for example bonding pads, and the I/O terminals of the housing are formed, and the housing is sealed.

Because of the multitude of steps and the complexity of each one of these steps in both parts of the production process of the integrated circuits, there is a substantial risk that a number of the integrated circuits produced will not meet their specifications. It is even quite possible that some of the integrated circuits produced will not function at all.

In general, a manufacturer of integrated circuits will strive to preclude that integrated circuits shipped to customers do not meet specifications or do not function at all. To achieve this, testing methods have been developed by means of which integrated circuits that do not meet specifications can be distinguished from integrated circuits that do meet specifications.

In the production process, each step to which an integrated circuit that does not meet specifications is subjected is, in principle, a waste of time and means. In general, the manufacturer of integrated circuits will strive to detect those integrated circuits that do not meet the specifications as early as possible in the production process, so that they can be removed from said production process.

Testing the functionality of integrated circuits at an early stage in the production process is possible at the end of the first part of the production process. At this stage in the production process, the integrated circuits are fully realized on the dies. The dies themselves still form part of the wafer.

An embodiment of such a method is known from said U.S. Pat. No. 5,808,947. In the known method, a wafer test method is described wherein metallization patterns are provided in the dicing lanes situated between the dies. These metallization patterns form part of a wafer test bus, which can function as a communication bus, and to which all integrated circuits situated on the dies of the wafer are connected by means of a wafer test bus circuit that can function as a communication bus circuit.

A wafer tester which is brought into contact with the metallization patterns by means of, for example, test probes can communicate via the wafer test bus circuits with the integrated circuits on the dies. In this manner, these integrated circuits can be tested, completely or partly, for functionality. By marking the integrated circuits that do not pass the test, these circuits can be selected so that they can be subsequently removed from the production process. The known method is deemed suitable, in particular, for application in the manufacture of integrated memory circuits.

A drawback of the known method resides in that on each die space must be reserved for a wafer test bus circuit that forms part of the integrated circuit. When carrying out the wafer test method, the integrated circuit must be brought into a wafer test mode to set the wafer test bus circuit functioning. After completion of the manufacturing process, the wafer test bus circuit does not function and hence only takes up space on the die during the further service life of the integrated circuit when, during normal operation, said circuit is in a functional mode.

It is an object of the invention to provide a method of manufacturing an integrated circuit, wherein a larger portion of the die, including the integrated circuit provided thereon, can be advantageously used during the entire service life of the integrated circuit, said method also comprising a testing method wherein the functionality of the integrated circuit is checked, partly or completely, when the die on which the integrated circuit is situated still forms part of the wafer.

This object is achieved by means of the method in accordance with the invention, which is characterized in that the communication bus circuit is embodied so as to be able to communicate in a wafer test mode as well as in a functional mode, and said communication bus circuit communicates in the wafer test mode during the testing of the integrated circuit.

A communication bus is frequently used to enable communication between integrated circuits in an application or apparatus. Apart from the physical connections between the integrated circuits, which consist of, for example, copper tracks on a printed circuit board where the integrated circuits are provided, such a communication bus also comprises circuits. Each integrated circuit that is connected to the communication bus is provided with such a communication bus circuit.

In the inventive method of manufacturing the integrated circuit, a metallization pattern is provided, in the course of the production process, in at least one dicing lane of the wafer of which the die, including the integrated circuit to be produced thereon, forms a detachable part. The metallization pattern serves to form a communication bus comprising at least one communication bus circuit that forms part of the integrated circuit to be produced. A wafer tester can now be brought into electroconductive contact, by means of, for example, test probes, with the metallization pattern in the dicing lane and hence with the communication bus.

The communication bus thus obtained is subsequently used as a wafer test bus, and the communication bus circuit present on the integrated circuit serves as a wafer test bus circuit. When the integrated circuit is tested according to a predetermined testing method, use is made of the wafer test bus. In a next step of the production process, after testing the integrated circuit, the die including the integrated circuit present thereon is detached from the wafer. In this manner, the aim of the invention is achieved by means of this method.

An additional advantage of the method in accordance with the invention resides in that the tested wafers, including the marked dies present thereon, can also be sold as semi-manufactured products.

In an embodiment of the method in accordance with the invention, the method is used to manufacture an integrated circuit comprising a solid-state image sensor with an image-pickup section. Methods of manufacturing solid-state image sensors are highly comparable to methods of manufacturing integrated circuits. In addition, the electrical output signals of image sensors are not automatically suitable for further processing. These signals must first be amplified by means of an amplifier circuit, and, in general, the amplified signals are subsequently digitized by means of an analog-to-digital converter. The circuits that are necessary for this purpose are generally embodied so as to be integrated circuits. By integrating these circuits with the image sensor so as to form a single integrated circuit on one die, an integrated circuit comprising an image sensor is obtained.

An advantage of this embodiment resides in that it is possible to completely or partly test the functionality of the integrated circuit comprising the solid-state image sensor when the die on which this integrated circuit is situated still forms part of the wafer, while the space available on the die is also efficiently used.

In a further embodiment of the method in accordance with the invention, an integrated circuit comprising a CMOS image sensor is manufactured by means of said method. The method in accordance with the invention is particularly advantageous when it is used to manufacture such an integrated circuit. Integrated circuits comprising CMOS image sensors are generally intended for consumer applications or products where a comparatively low image resolution is accepted, while further functionality requirements are also less stringent. As a result, the surface area necessary to realize the functionality of the integrated circuit is reduced and the communication bus circuit will occupy a comparatively larger part of the surface area. In addition, integrated circuits for consumer applications or consumer products are generally produced in large numbers, and the manufacturer will strive to form as many integrated circuits as possible on a wafer. By making sure that the communication bus circuit that forms part of the integrated circuit communicates both in a wafer test mode and in a functional mode, a saving in die surface area is achieved and hence the possibility is created to produce more integrated circuits on a wafer.

In a further embodiment of the method in accordance with the invention, the communication bus for use in the testing method communicates in a serial mode. In the case of a communication bus that communicates in a serial mode, the number of necessary connections is limited. As a result, the number of necessary, individual tracks in the metallization pattern provided on the wafer is also limited. This has the advantage that the metallization pattern takes up comparatively little space.

In a further embodiment of the method in accordance with the invention, the communication bus used in the testing method communicates in accordance with the I$^2$C standard. Comparatively many integrated circuits are commercially available which use the I$^2$C standard for communicating with other integrated circuits in the same application or the same product. The use of this standard in the method in accordance with the invention has the advantage that it is possible to communicate with a comparatively large number of other integrated circuits, which leads to a comparatively large number of possible applications and products wherein the integrated circuit obtained by means of the method can be employed.

An integrated circuit in accordance with the invention is characterized in that the communication bus circuit is embodied so as to communicate, during (at least a part of) the manufacturing process, in a wafer test mode and to communicate in a functional mode during normal operation.

A wafer in accordance with the invention is characterized in that the metallization pattern is embodied so as to form a communication bus comprising at least one communication bus circuit that forms part of the integrated circuit and that is embodied so as to communicate in a wafer test mode as well as in a functional mode.

A system in accordance with the invention comprising a first and a second integrated circuit is characterized in that the first integrated circuit is an integrated circuit in accordance with the invention.

These and other aspects of the invention are apparent from and will be elucidated with reference to the embodiment(s) described hereinafter.

In the drawings:

FIG. 1 diagrammatically shows a method of manufacturing an integrated circuit in accordance with the state of the art. In the production process 1 shown, slices of semiconductor material from the starting point 2 (BW) and finished products (FP) from the result 3 of the production process. The production process 1 comprises a first part 4 and a second part 5.

Figure 4:
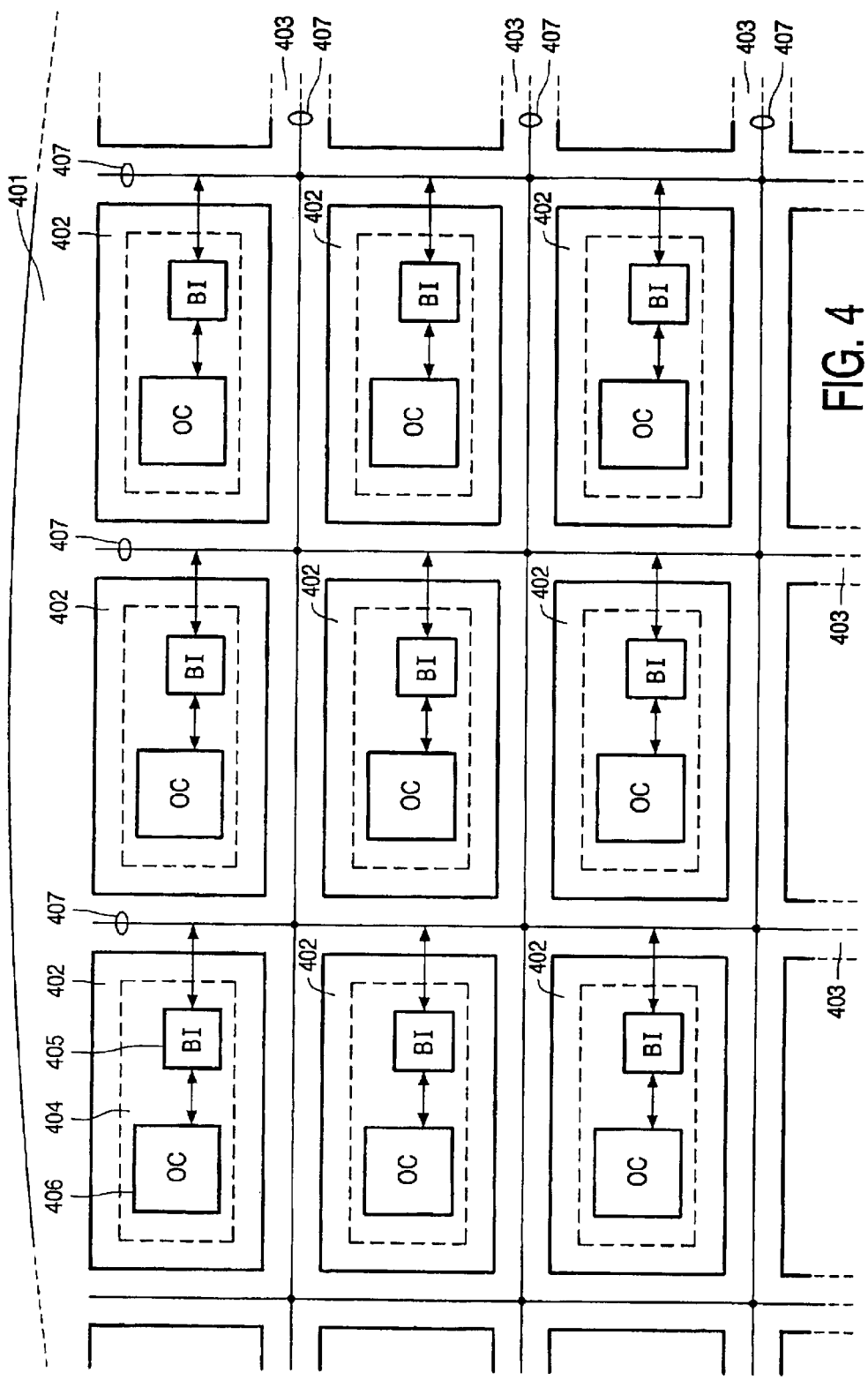
Figure 5:
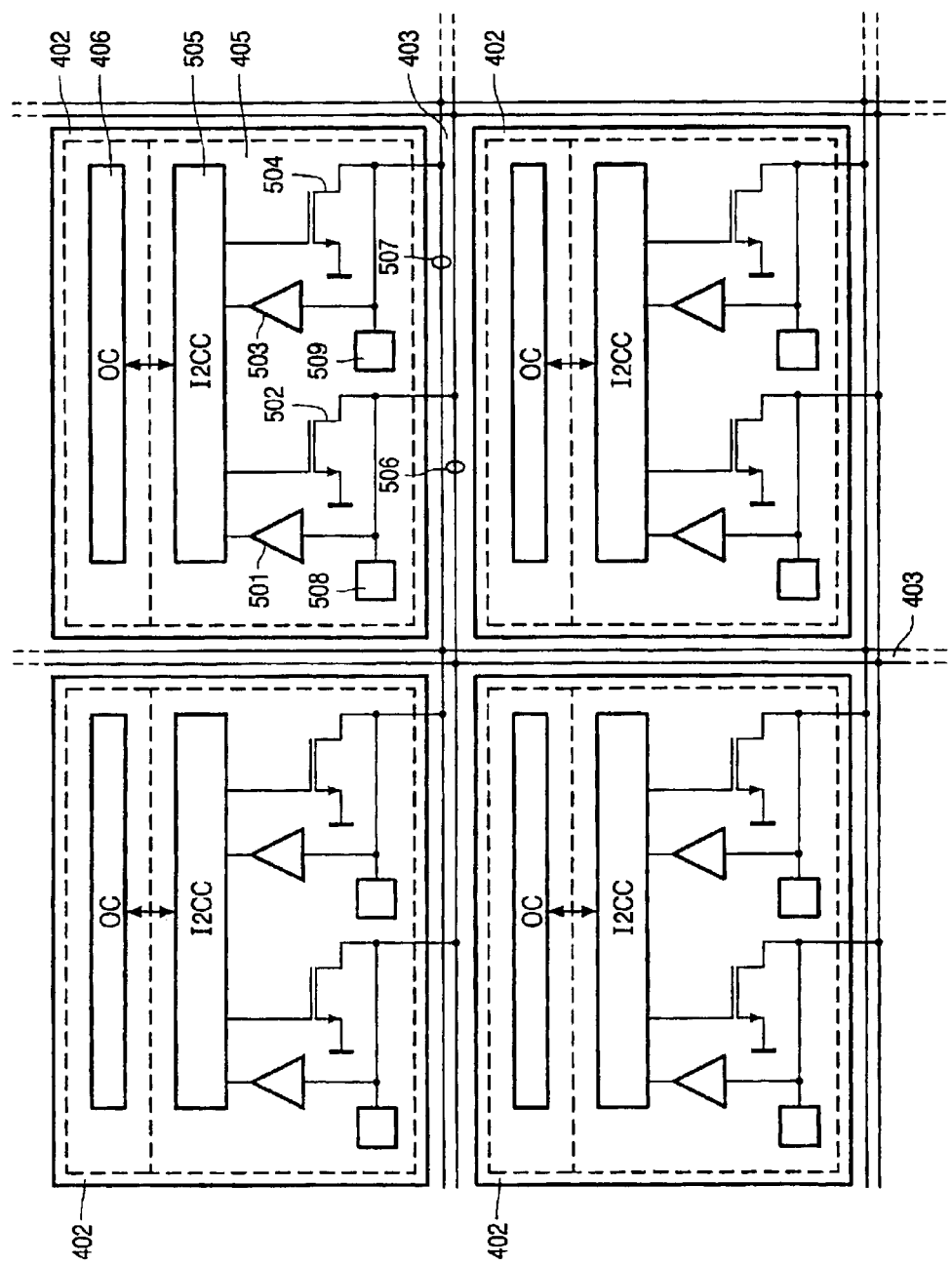
Figure 6:
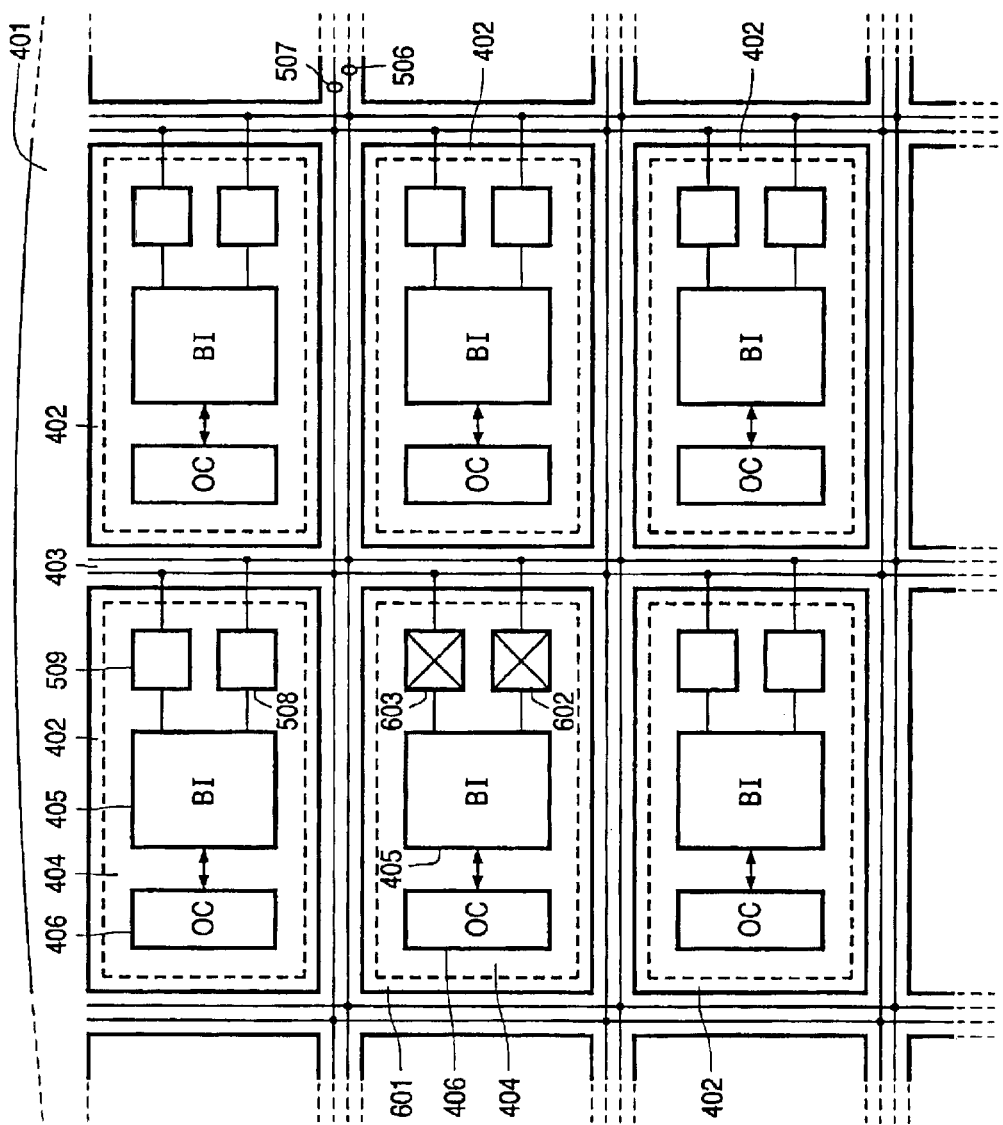
Figure 7:
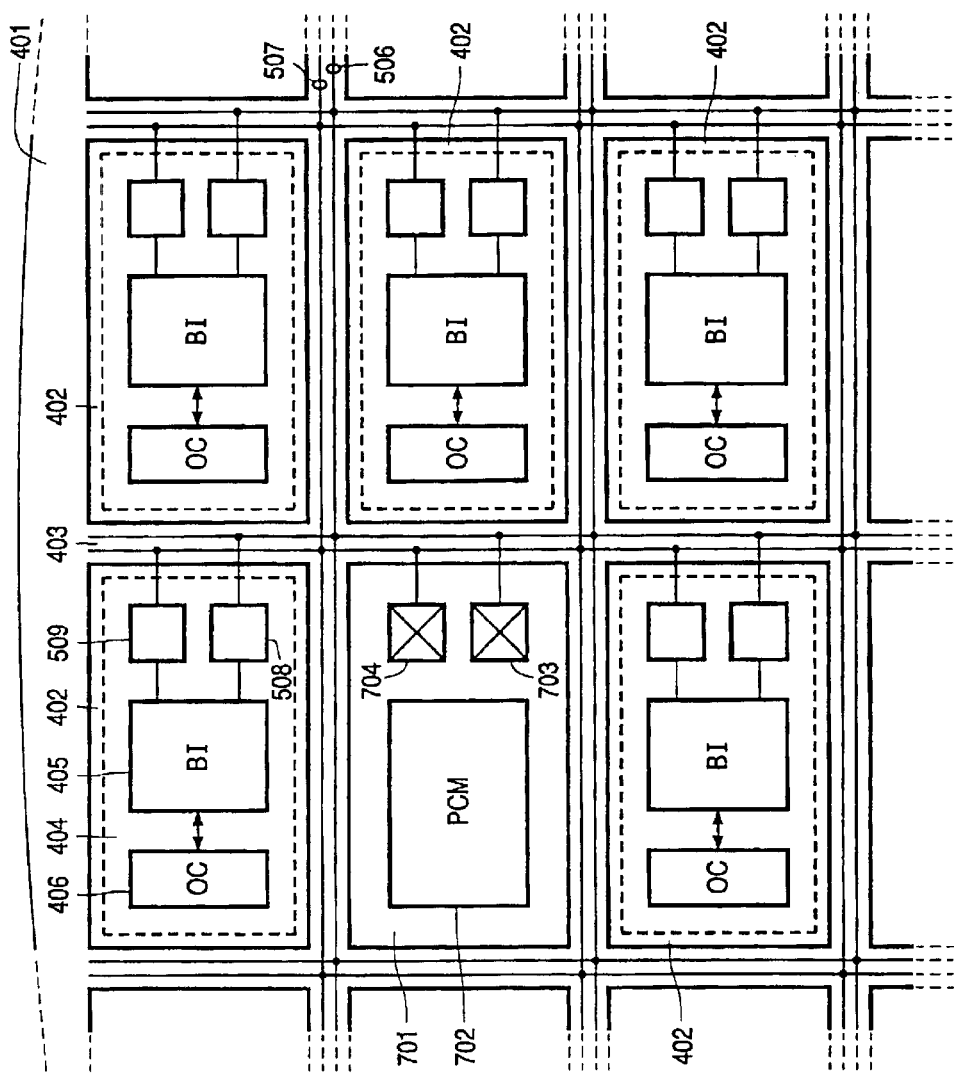
Figure 8:
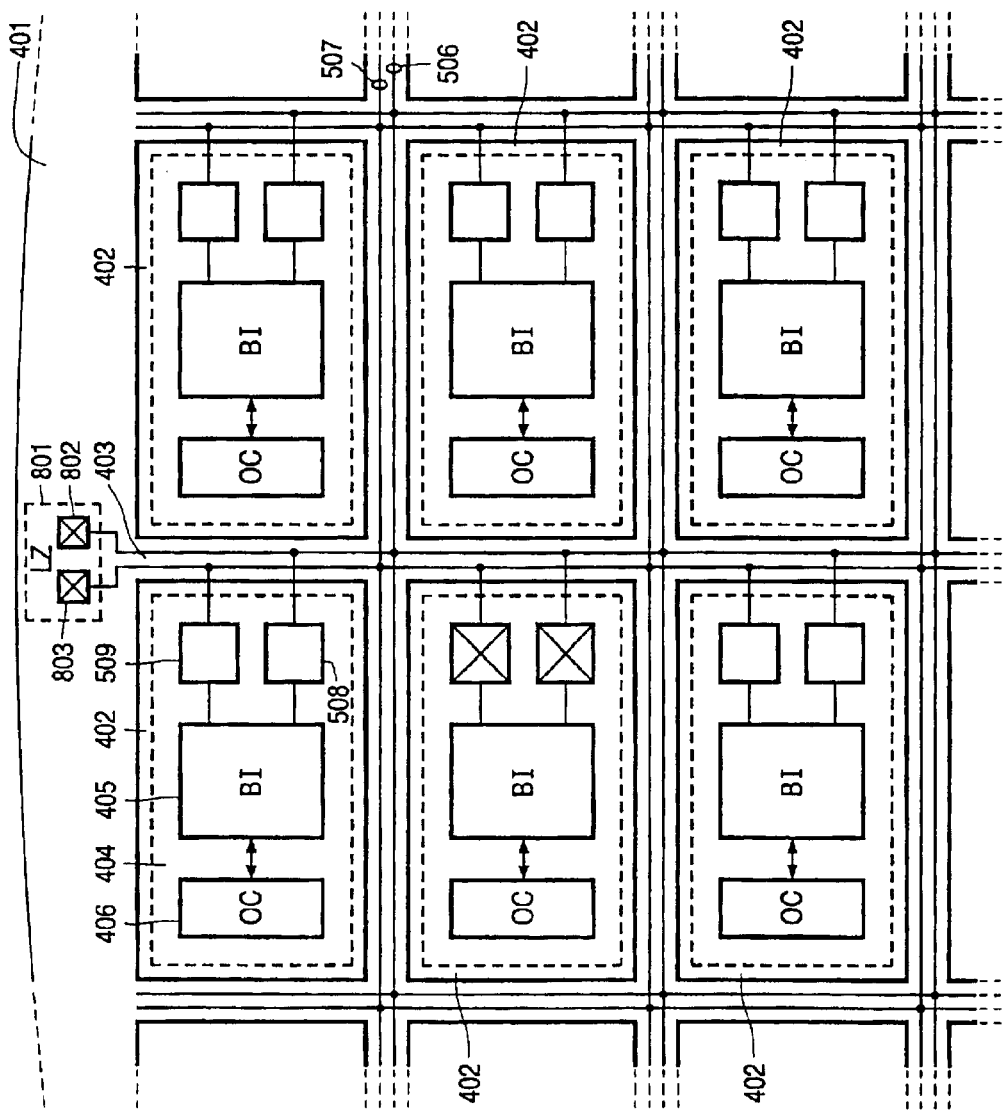
Figure 9:
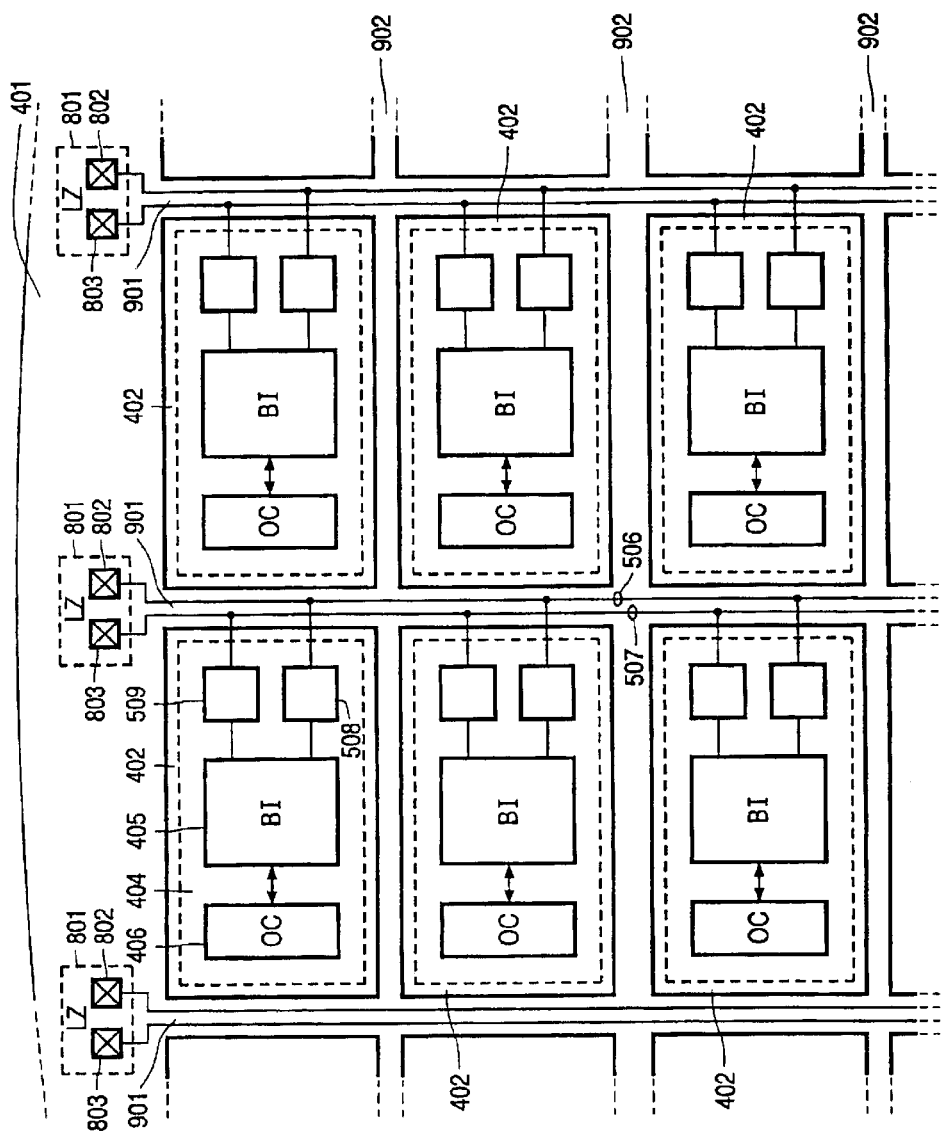
Figure 10:
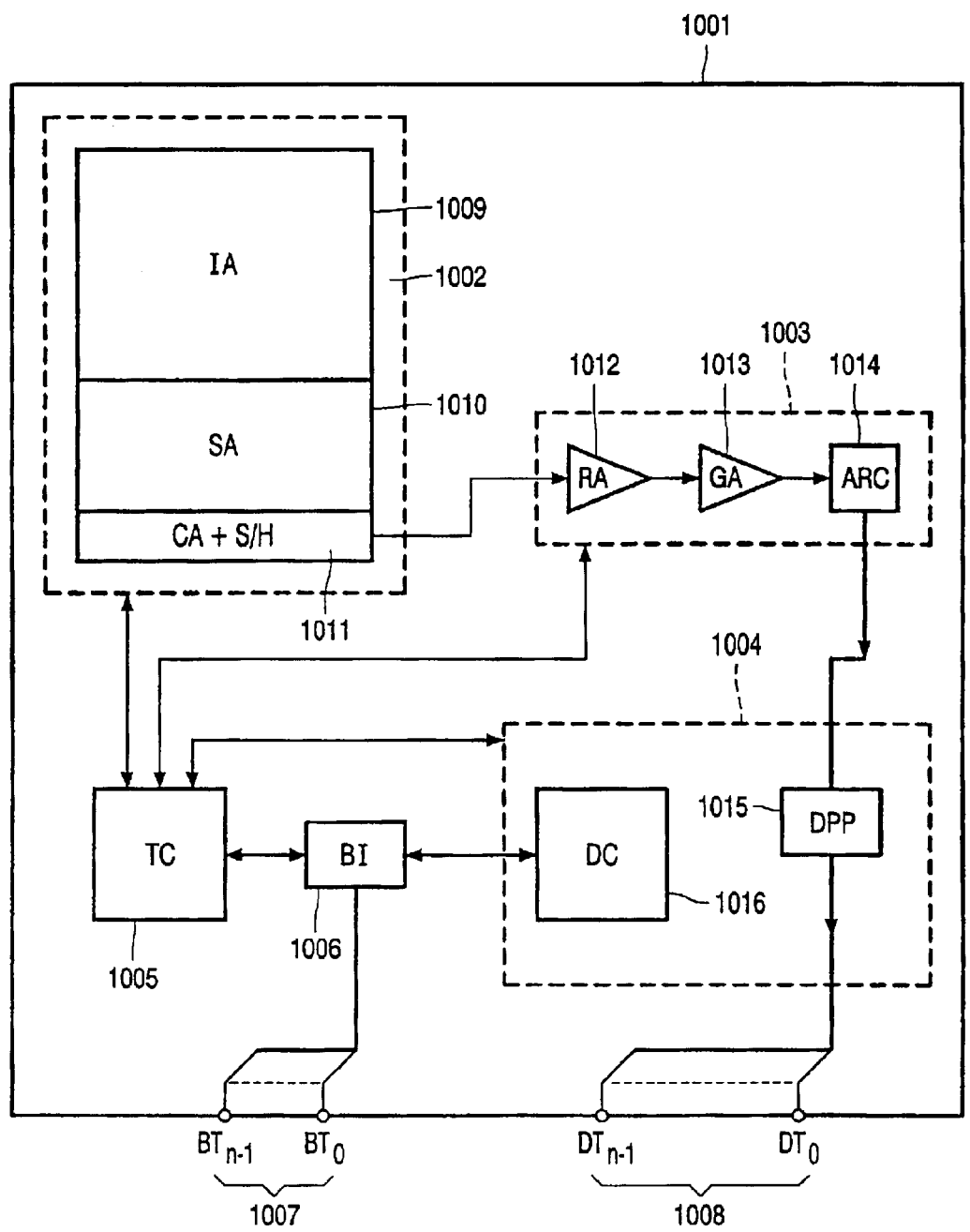
Figure 11:
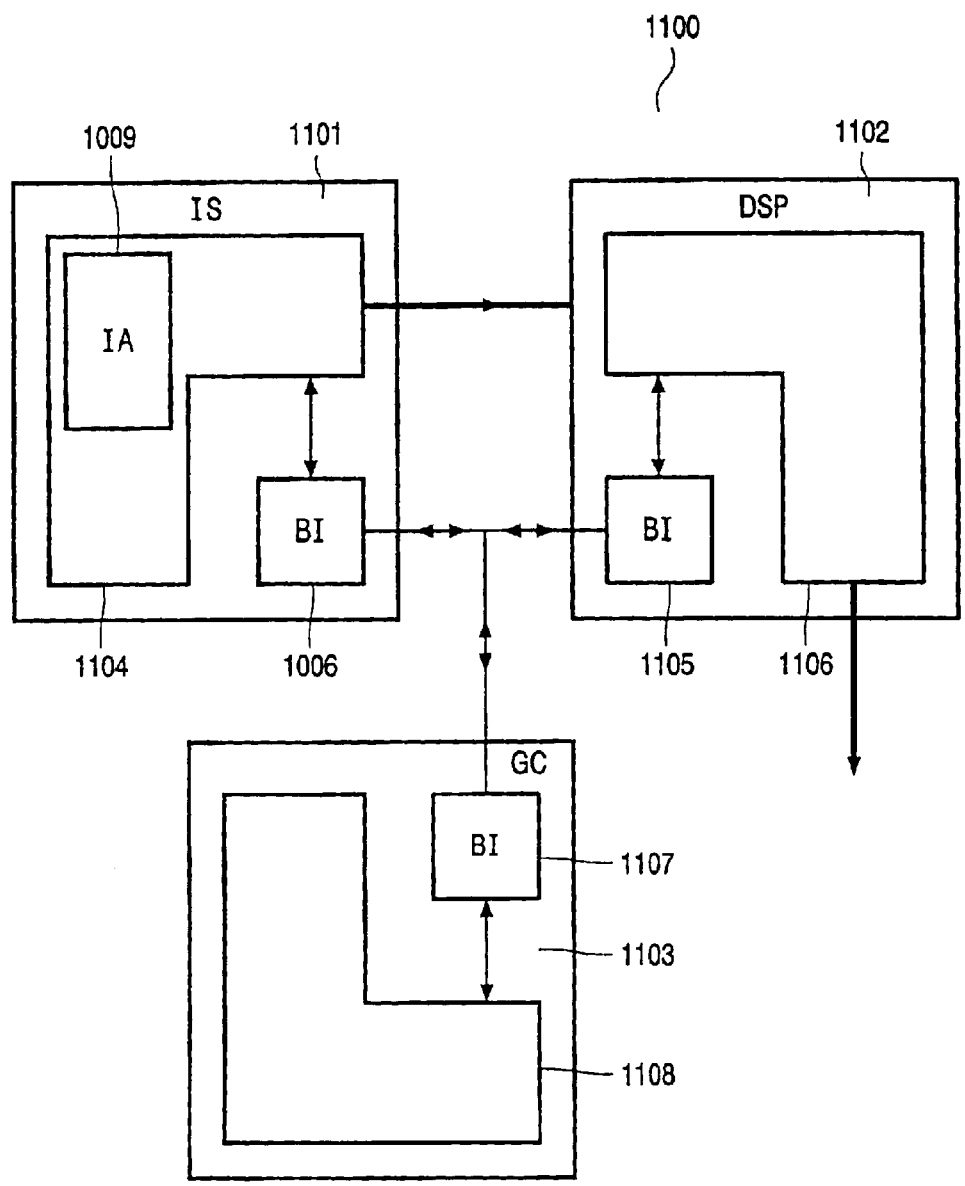

FIG. 4 diagrammatically shows an embodiment of a wafer for use in a method of manufacturing an integrated circuit;

FIG. 5 diagrammatically shows an embodiment of an integrated circuit comprising a communication bus circuit that forms part of a communication bus;

FIG. 6 diagrammatically shows a further embodiment of a wafer for use in a method of manufacturing an integrated circuit;

FIG. 7 diagrammatically shows a further embodiment of a wafer for use in a method of manufacturing an integrated circuit;

FIG. 8 diagrammatically shows a further embodiment of a wafer for use in a method of manufacturing an integrated circuit;

FIG. 9 diagrammatically shows a further embodiment of a wafer for use in a method of manufacturing an integrated circuit;

FIG. 10 diagrammatically shows an embodiment of an integrated circuit provided with a solid-state image sensor;

FIG. 11 diagrammatically shows an embodiment of a camera system.

In these Figures, like reference numerals refer to like parts.

Figure 1:
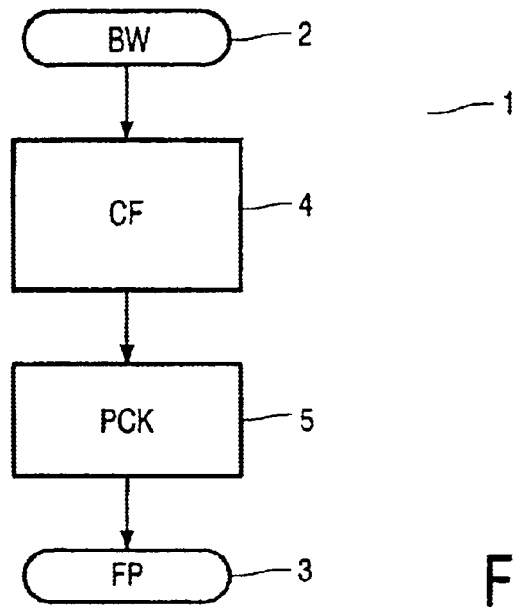

FIG. 1 diagrammatically shows a method of manufacturing an integrated circuit in accordance with the state of the art. In the production process 1 shown, slices of semiconductor material form the starting point 2 and finished products form the result 3 of the production process. The production process 1 comprises a first part 4 and a second part 5.

In the first part 4 of the production process, slices of semiconductor material, for example silicon, are used as the starting material, which are subjected to a large number of steps that are not shown in the drawing. In these steps, for example, ions are implanted, diffusions are carried out and metallizations are provided that are partly etched away again so as to form metallization patterns that form interconnections (CF) between different devices. After the first part 4 of the production process has been completed, dies with integrated circuits thereon are formed on the wafer. The spaces between the dies are customarily referred to as dicing lanes.

In the second part 5 of the production process (PCK), the wafer on which the dies are formed, i.e. the result of the first part 4 of the production process, is also subjected to a large number of steps that are not shown in the drawing. In these steps, for example, the dies are detached from the wafer along the dicing lanes, the dies are accommodated in a housing, electroconductive connections are formed between I/O terminals of the integrated circuits, for example bonding pads, and I/O terminals of the housing, after which the housing is sealed. This results in result 3 of the production process, i.e. finished products.

Figure 2:
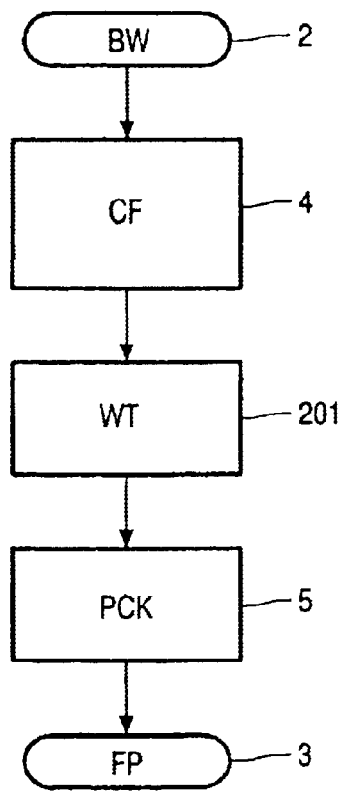
FIG. 2 is a further diagrammatic representation of the method of manufacturing an integrated circuit in accordance with the state of the art.

FIG. 2 shows a further diagrammatic representation of a method of manufacturing an integrated circuit in accordance with the state of the art. In this diagrammatic representation, a third part 201 of the production process is inserted between the first part 4 of the production process and the second part 5 of the production process. In this third part 201 of the production process, the integrated circuits are tested for functionality, while the dies on which they are situated still form part of the wafer (WT).

Owing to the multiplicity of steps in the production process 1 and the complexity of each of the steps in the first part 4 and the second part 5 of the production process, there is a substantial risk that a number of the integrated circuits produced do not meet their specifications. It is even quite likely that some of the integrated circuits produced will not function at all.

In general, a manufacturer of integrated circuits will strive to preclude that integrated circuits that do not meet their specifications, or do not function at all, are shipped to customers. In order to achieve this, testing methods have been developed enabling integrated circuits that do not meet their specifications to be distinguished from integrated circuits that do meet their specifications.

In the production process 1, each step to which an integrated circuit that does not meet its specifications is subjected is essentially a waste of time and means. In general, the producer of integrated circuits will strive to distinguish integrated circuits that do not meet their specifications as early as possible in the production process 1 so that they can be removed from said production process 1.

Testing of the functionality of the integrated circuit at an early stage in the production process 1 can take place at the end of the first part 4 of the production process. This is represented by means of the third part 201 of the production process.

Figure 3:
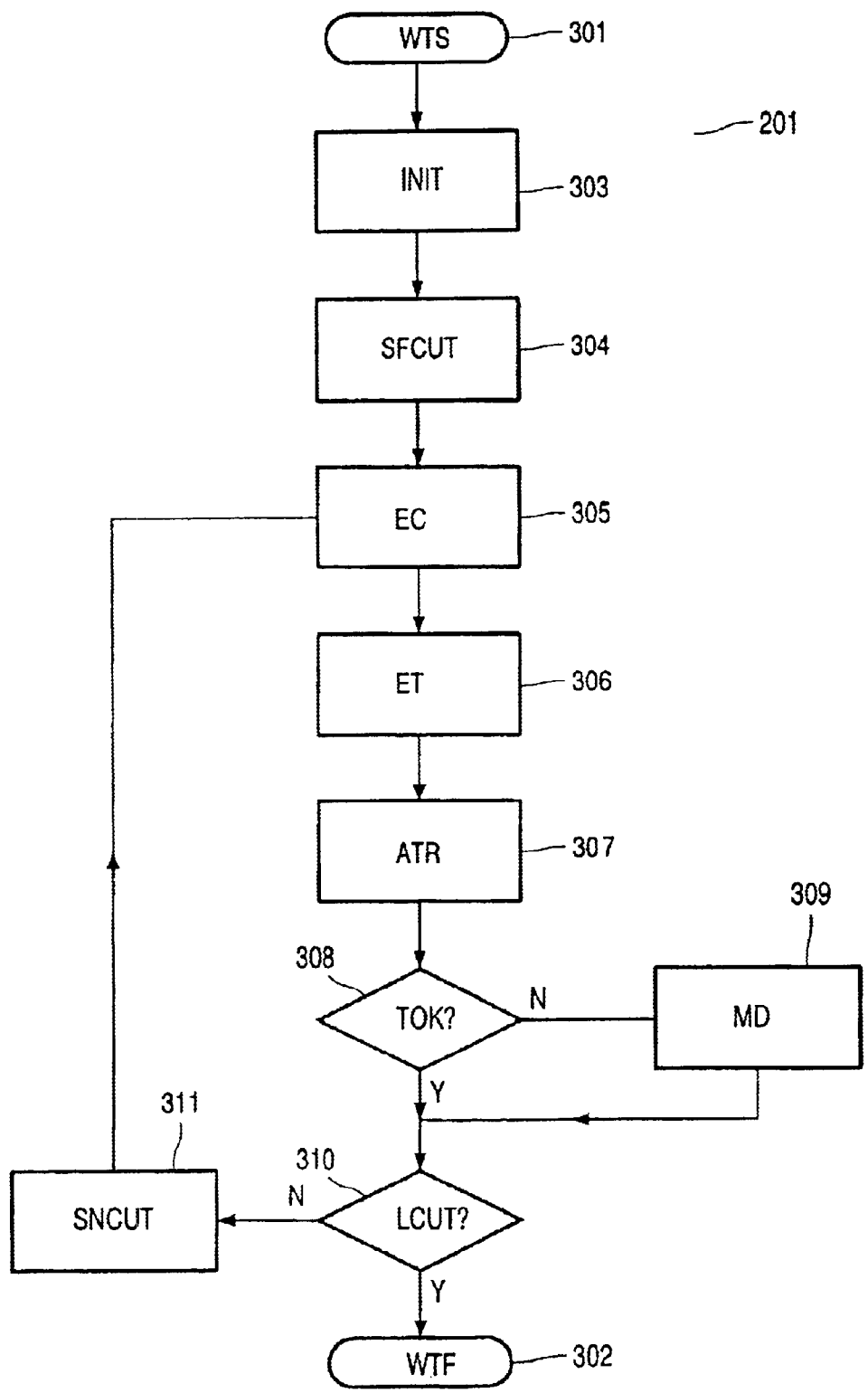
FIG. 3 is a more detailed diagrammatic representation of a part of the method of manufacturing an integrated circuit in accordance with the state of the art.

FIG. 3 is a more detailed diagrammatic representation of a part of the method of manufacturing an integrated circuit in accordance with the state of the art. Said Figure shows a more detailed diagrammatic representation of the third part 201 of the production process, wherein the integrated circuits are tested for functionality, while the dies on which they are situated still form part of the wafer.

The block 301 indicates the beginning of the third part 201 of the production process (WTS). Block 302 (WTF)—indicates the end of the third part 201 of the production process. An initialization (INIT) takes place in a first step 303. In this step, for example, the wafer can be positioned in a wafer tester. In a subsequent step 304, for example, a first die on the wafer is selected, the wafer tester electroconductively contacts the integrated circuit on the first die selected, and a supply voltage is delivered to the integrated circuit (SFCUT). In a next step 305, for example, a test circuit forming part of the integrated circuit is brought into a starting state (EC) for testing the functionality of the integrated circuit. In a subsequent step 306, inter alia, the tests are carried out (ET), after which the results of these tests are relayed to the wafer tester. In a next step 307, inter alia, the results of the tests are analyzed (ATR). In a next step 308, it is inter alia decided whether the integrated circuit functions in a satisfactory manner (TOK?). Should the functioning of the integrated circuit be unsatisfactory, a next step 309 is carried out. If the functioning of the integrated circuit is satisfactory, step 309 is skipped. Step 309 is used, inter alia, to register that the integrated circuit functions unsatisfactorily. This is customarily indicated by means of a color marking on the die (MD), for example using colored ink. After step 308, which may or may not be followed by step 309, a subsequent step 310 is carried out where it is decided, inter alia, whether all integrated circuits situated on the wafer have already been tested (LCUT?). If so, the procedure moves on to the end 302 of the third part of the production process. If, however, not all integrated circuits have been tested yet, the procedure moves on to a next step 311. In step 311, inter alia, the next die on the wafer is selected (SNCUT). After step 311, the procedure returns to step 305.

FIG. 4 diagrammatically shows an embodiment of a wafer 401 for use in a method of manufacturing an integrated circuit. Said wafer 401 comprises dies 402. Juxtaposed dies are separated from each other by means of a dicing lane 403. An integrated circuit 404 is situated on the die 402. Also the I/O terminals of the integrated circuit 404, which are not shown, are situated on the die 402. In FIG. 4, the integrated circuit comprises a communication bus circuit 405 (BI) and other electronics 406 (OC) that are interconnected in a customary manner so that they can communicate with one another. Furthermore, the communication bus circuit 405 is electroconductively connected, in a suitable manner, to a metallization pattern 407 provided in the dicing lane 403. The various metallization patterns 407 are also electrically interconnected in a suitable manner. In this manner, a communication bus is achieved that comprises the communication bus circuits 405 and the metallization patterns 407.

In the embodiment disclosed in U.S. Pat. No. 5,808,947, the metallization patterns 407 in the dicing lanes 403 between the dies 402 form part of a wafer test bus that can function as a communication bus to which all integrated circuits 404 situated on the dies 402 of the wafer 401 are connected by means of a wafer test bus circuit that can function as a communication bus circuit.

A wafer tester that is brought into contact with the metallization patterns, for example by means of test probes, can communicate with the integrated circuits 404 on the dies 402 via the wafer test bus circuits. In this manner, these integrated circuits can be tested, completely or partly, for functionality. By marking the integrated circuits that do not pass the test, said circuits can be selected and subsequently removed from the production process. The known method is deemed suitable, in particular, for use in the production of integrated memory circuits.

A drawback of the known method resides in that on each die 402 space must be reserved for a wafer test bus circuit forming part of the integrated circuit 404. When carrying out the wafer test method, the integrated circuit must be brought into a wafer test mode to set the wafer test bus circuit functioning. After completion of the manufacturing process, the wafer test bus circuit does not function and hence only takes up space on the die during the further service life of the integrated circuit when, during normal operation, said circuit is in a functional mode.

A characteristic difference between the method in accordance with the invention and the method disclosed in U.S. Pat. No. 5,808,947 is that the communication bus circuit 405 is embodied so as to communicate in a wafer test mode as well as in a functional mode. When the integrated circuit 404 is being tested, the communication bus circuit communicates in the wafer test mode and, during normal operation, the communication bus circuit can communicate in the functional mode.

To enable communication between integrated circuits in an application or apparatus, use is often made of a communication bus. Apart from the physical connections between the integrated circuits, which consist, for example, of copper tracks on a printed circuit board on which the integrated circuits are provided, the communication bus comprises communication bus circuits. Each integrated circuit that is connected to the communication bus is provided with such a communication bus circuit. An example of such an application is a camera system comprising a solid-state image sensor. An embodiment thereof is shown in FIG. 11.

In the method in accordance with the invention, the metallization patterns 407 are provided in the dicing lanes 403 of the wafer 401 in the course of the first part 4 of the production process. In this manner, the communication bus is formed jointly with the communication bus circuits 405. In the third part 201 of the production process a wafer tester can now be brought into electroconductive contact, for example by means of test probes, with the metallization patterns 407 and hence with the communication bus.

The communication bus thus formed is subsequently used as a wafer test bus, and the communication bus circuits 405 are used as a wafer test bus circuit. To test the integrated circuit 404 on the wafer 401 in accordance with a predetermined testing method, use is made of the wafer test bus. In the second part 5 of the production process, after testing the integrated circuit 404 on the wafer, the die 402 is detached from the wafer 401. For practical reasons it may be advantageous to divide the wafer 401 into a number of sections which are provided with a communication bus of their own.

FIG. 5 diagrammatically shows an embodiment of an integrated circuit comprising a communication bus circuit that forms part of a communication bus. FIG. 5 shows a part of the wafer 401 with a number of dies 402, juxtaposed dies 402 being separated from each other by a dicing lane 403. The integrated circuit present on the die 402 comprises the communication bus circuit 405 and the remaining electronics 406. The communication bus circuit 405 is capable of communicating in a wafer test mode as well as in a functional mode. In the embodiment shown, the communication bus circuit 405 is a $I^2C$ bus interface circuit that communicates in accordance with the $I^2C$ standard. The $I^2C$ interface circuit comprises a first input buffer 501, a first output buffer 502, a second input buffer 503, a second output buffer 504 and other $I^2C$ interface electronics 505.

Communication in accordance with the $I^2C$ standard requires a serial data line (SDA) and a serial clock line (SCL). To enable bidirectional communication over an SDA, the remaining $I^2C$ interface electronics 505 is electroconductively connected to the output of the first input buffer 501 and the input of the first output buffer 502. To enable bidirectional communication over an SCL, the remaining $I^2C$ interface electronics 505 is electroconductively connected to the output of the second input buffer 503 and the input of the second output buffer 504.

To form a communication bus that communicates in accordance with the $I^2C$ standard and that can be used as a wafer test bus, the metallization pattern 407 comprises a wafer-SDA 506 and a wafer-SCL 507. The wafer-SDA 506 is electroconductively connected to the input of the first input buffer 501 and to the output of the first output buffer 502. The wafer-SCL 507 is electroconductively connected to the input of the second input buffer 503 and to the output of the second output buffer 504.

The die 402 further comprises a first bonding pad 508 and a second bonding pad 509. The first bonding pad 508 and the second bonding pad 509 can be used as I/O terminals of the integrated circuit 404 as soon as the integrated circuit has gone through every stage of the production process and forms part of the finished product and functions in a functional mode. The die 402 also comprises other bonding pads, not shown, that can function as further I/O terminals of the integrated circuit 404.

The first bonding pad 508 is electroconductively connected to the input of the first input buffer 501 and to the first output buffer 502. The second bonding pad 509 is electroconductively connected to the input of the second input buffer 503 and to the output of the second output buffer 504. Once the communication bus circuit 405 functions in a functional mode, it can thus form part, in a suitable manner, of the $I^2C$ bus that also includes other integrated circuits. An example of this is the camera system shown in FIG. 11.

FIG. 6 diagrammatically shows a further embodiment of a wafer for use in a method of manufacturing an integrated circuit. From the dies 402 situated on the wafer, one die is selected as the probe die 601. In the embodiment shown, said probe die 601 comprises the same integrated circuit 404 as the other dies 402.

To carry out tests on the integrated circuits 404, the wafer tester makes contact, for example via test probes, with a first bonding pad 602 of the probe die and with a second bonding pad 603 of the probe die. The first bonding pad 602 of the probe die and the first bonding pad 508 are both electroconductively connected to the wafer-SDA 506. The second bonding pad 603 of the probe die 803 and the second bonding pad 509 are electroconductively connected to the wafer-SCL 507. In this manner, the wafer tester can communicate, via the wafer-SDA 506 and the wafer-SCL 507, with the communication bus circuits 405 situated on the probe die 601 and on the dies 402.

FIG. 7 diagrammatically shows a further embodiment of a wafer for use in a method of manufacturing an integrated circuit. In this embodiment, the wafer 401 comprises the dies 402 on which the integrated circuits 404 are situated, and a PCM die 701 on which a process control module (PCM) 702 is situated. The PCM comprises test structures that are used to check whether the production process was free of irregularities. This check is conducted before the functionality of the integrated circuits is tested. During testing the functionality of the integrated circuits, the PCM is not used. If there is any space left on the PCM, however, then this space can be used to provide a first test pad 703 and a second test pad 704. This has the advantage that the available space on the wafer is used more efficiently and that it is not necessary to sacrifice a die on which an integrated circuit is present to obtain a probe die that is unsuitable for further processing to obtain a finished product. This can be attributed to the fact that bonding pads used as test pads are very likely to have suffered damage.

In order to enable testing on the integrated circuits 404, the wafer tester makes contact, for example via test probes, with the first test pad 703 of the PCM die and the second test pad 704 of the PCM die. The first test pad 703 of the PCM die and the first bonding pad 508 are both electroconductively connected to the wafer-SDA 506. The second test pad 704 of the PCM die 701 and the second bonding pad 509 are electroconductively connected to the wafer-SCL 507. In this manner, the wafer tester can communicate, via the wafer-SDA 506 and the wafer-SCL 507, with the communication bus circuits 405 situated on the dies 402.

FIG. 8 diagrammatically shows a further embodiment of a wafer for use in a method of manufacturing an integrated circuit. In this embodiment, space for a landing zone 801 is reserved on the wafer 401. In the landing zone 801 there is a first wafer test pad 802 and a second wafer test pad 803.

In order to enable testing on the integrated circuits 404, the wafer tester makes contact, for example via test probes, with the first wafer test pad 802 and the second wafer test pad 803. The first wafer test pad 802 and the first bonding pad 508 are both electroconductively connected to the wafer-SDA 506. The second wafer test pad 803 and the second bonding pad 509 are both electroconductively connected to the wafer-SCL 507. In this manner, the wafer tester can communicate, via the wafer-SDA 506 and the wafer-SCL 507, with the communication bus circuits 405 situated on the dies 402.

FIG. 9 diagrammatically shows a further embodiment of a wafer for use in a method of manufacturing an integrated circuit. This embodiment is a modification of the embodiment shown in FIG. 8. In the embodiment shown in FIG. 9, the wafer 401 is divided into a number of sections each of which is provided with a landing zone 801 of its own. In the embodiment shown, each column forms a section. Of course it is also possible to choose a different division, for example a subdivision into four quadrants. An advantage of dividing the wafer 401 into a number of different sections is that less space is necessary for the metallization pattern in the dicing lanes. For example, in the division into columns shown in FIG. 9, a metallization pattern is provided only in the dicing lanes 901 that extend from top to bottom in the Figure. The dicing lanes 902 extending from left to right in the Figure remain free and can be used, if necessary, for other purposes, such as for placing one or more PCMs.

Also in the embodiment shown in FIG. 6 and FIG. 7, it may be advantageous to divide the wafer into different sections in a manner comparable to that shown in FIG. 9. In the embodiment shown in FIG. 6, and in the case where the integrated circuit 404 comprises a solid-state image sensor, it may be favorable to arrange all, or substantially all, bonding pads near one edge of the die 402 or the probe die 601. The expression "substantially all bonding pads near one edge of the die" is to be taken to mean that all-bonding pads that are necessary to carry out tests on the wafer are situated near one edge of the die. These include, in addition to the bonding pads that are electroconductively connected to the communication bus circuit, for example the bonding pads that are electroconductively connected to the supply lines of the integrated circuit 404 and the bonding pads that are electroconductively connected to the signal inputs and outputs of the integrated circuit 404. In a manner comparable to the bonding pads that are electroconductively connected to the communication bus circuit 405, all other bonding pads situated on different dies 402 can be electroconductively interconnected via a second metallization pattern present in the dicing lane 403. Subsequently, for example, all integrated circuits 404 situated in one section of the wafer can be simultaneously supplied with a supply voltage via test probes that have been brought into electroconductive contact with appropriate bonding pads on the probe die 601.

To test the solid-state image sensor use is made of a light source projecting one or more images on the solid-state image sensor. To achieve this use can be made, for example, of a wafer tester that is provided with a movable light source that can always be positioned above each solid-state image sensor. In this manner, different integrated circuits 404 situated in one section of the wafer 401 can be successively tested. In this process, the test probes always remain in electroconductive contact with the first bonding pad 602 of the probe die 601 of the relevant section and with the second bonding pad 603 of the probe die 601 of the relevant section. By always choosing one column as the section and arranging all bonding pads so as to be near one edge of the die, it is precluded that the test probes cast undesirable shadows over the solid-state image sensors to be tested.

FIG. 10 diagrammatically shows an embodiment of an integrated circuit provided with a solid-state image sensor. The integrated circuit 1001 comprises an image pickup section 1002, an analog section 1003, a digital section 1004, a test controller (TC) 1005, a communication bus circuit (BI) 1006, I/O terminals of the communication bus circuit 1007 and output terminals for the digital output signal 1008.

The image pickup section 1002 is responsible for the conversion of light images into analog electric signals. Said image pickup section 1002 comprises a pickup portion (IA) 1009, a memory portion (SA) 1010, a sample-and-hold portion (CA+S/H) 1011. In the pickup portion, incident light images are converted into analog electric signals, for example charge packets. These analog electric signals can be stored temporarily in the memory portion 1010. Subsequently, the analog electric signals are sampled in the sample-and-hold portion 1011.

The analog section 1003 makes sure that the sampled analog electric signal is amplified and subsequently digitized. The analog section 1003 comprises a preamplifier 1012, an adjustable gain amplifier 1013, for example an amplifier provided with an automatic gain control (AGC), and an analog-to-digital converter (ARC) 1014. The sampled analog electric signal is amplified by means of the preamplifier 1012 and the adjustable gain amplifier 1013. Subsequently, the signal is digitized by means of the analog-to-digital converter. This results in a digitized electric signal.

The digital section 1004 makes sure that the digitized electric signal is made suitable for further processing by other integrated circuits. The digital section comprises a digital signal processing processor 1015 and a digital controller 1016. The digitized electric signal is processed by the digital signal processing processor 1015 so that a digital output signal is obtained in a form suitable for further processing by other integrated circuits. The digital signal processing processor 1015 converts the digitized electric signal to, for example, a video signal of a customary format. The digital output signal can be sent via the output terminals 1008 to another integrated circuit.

The digital controller 1016 makes sure that the different tasks of the image pickup section 1002, the analog section 1003 and the digital section 1004 are attuned to one another. In addition, the digital controller 1016 can communicate with other integrated circuits to exchange information about the digital output signal or to make sure that tasks to be carried out are geared to one another. The digital controller communicates with other integrated circuits via the communication bus circuit 1006 and the I/O terminals 1007 of the communication bus circuit which are suitably connected to a communication bus that is not shown.

The integrated circuit 1001 also comprises a test controller 1005. This controller tests the operation of the image pickup section 1002, the analog section 1003 and the digital section 1004. This takes place in the course of the production process, at a moment in time when the die on which the integrated circuit is formed is not yet detached from the wafer. The test controller 1005 can communicate with a wafer tester via the communication bus circuit 1006. For this purpose, the communication bus circuit 1006 is connected to a communication bus to which also the wafer tester is connected. This takes place in one of the ways shown in FIG. 4, FIG. 5, FIG. 6, FIG. 7, FIG. 8 or FIG. 9.

In a modification of the integrated circuit 1001 shown, the test controller 1005 is omitted and the wafer tester can communicate directly, during the testing procedure, via the communication bus circuit 1006 with the image pickup section 1002, the analog section 1003 and the digital section 1004. This has the advantage that a further saving in space is achieved.

FIG. 11 diagrammatically shows an embodiment of a camera system 1100. The embodiment shown comprises an image sensor (IS) 1101, a digital signal processing processor (DSP) 1102 and a controller 1103. The image sensor converts incident light images into electric signals and sends them to the digital signal processing processor 1102 after they have been digitized and converted to a suitable format. The digital signal processing processor 1102 carries out further processes, for example color corrections, adaptation of the image format, or encoding so that the signals are rendered suitable for further transfer or for storage on a suitable medium, for example a videocassette or a hard disc. This is not shown in FIG. 11. The controller (GC) 1103 makes sure that the various tasks carried out in the camera system 1100 are geared to one another and may also be responsible, for example, for controlling the user interface with the user of the camera system 1100.

The image sensor 1101 may be the integrated circuit 1001 shown in FIG. 10 and comprises the communication bus circuit (BI) 1006 and further functional electronics 1104, such as pickup portion (IA) 1009. The digital signal processing processor 1102 comprises a communication bus circuit 1105 and further functional electronics 1106. The controller 1103 comprises a communication bus circuit 1107 and further functional electronics 1108. The communication bus circuits 1006, 1105 and 1107 are suitably brought into contact with each other and form part of the same communication bus. Via this communication bus, the image sensor 1101, the digital signal processing processor 1102 and the controller 1103 can communicate with each other and exchange information.

What is claimed is:

1. A method of manufacturing an integrated circuit (404) on a die (402) that is formed as a detachable part of a wafer (401) comprising a plurality of dies (402) that are separated from each other by dicing lanes (403), which method comprises a step of providing a metallization pattern (407) in at least one of the dicing lanes (403) so as to form a communication bus comprising at least one communication bus circuit (405) that forms part of the integrated circuit (404), which step is followed by a step wherein the integrated circuit (404) is tested in accordance with a predetermined testing method that utilizes the communication bus circuit (405) for communication with the integrated circuit (404), after which a step is carried out wherein the die (402) is detached from the wafer (401), characterized in that the communication bus circuit (405) is embodied so as to be able to communicate in a wafer test mode as well as in a functional mode, and said communication bus circuit communicates in the wafer test mode during the testing of the integrated circuit (404).

2. A method as claimed in claim 1, characterized in that the method is used to manufacture an integrated circuit (1001) comprising a solid-state image sensor with an image pickup section (1002).

3. A method as claimed in claim 1, characterized in that the method is used to manufacture an integrated circuit (1001) comprising a CMOS image sensor.

4. A method as claimed in claim 1, characterized in that the communication bus circuit communicates in a serial mode when it is used in the testing method.

5. A method as claimed in claim 1, characterized in that the communication bus circuit communicates in accordance with the $I^2C$ standard when it is used in the testing method.

6. A method as claimed in claim 2, characterized in that the testing method tests at least one section of the group consisting of the image pickup section (1002), an analog section (1003) and a digital section (1004) of the integrated circuit (1001).

7. An integrated circuit (404) provided with a communication bus circuit (405) and situated on a die (402), which die was a detachable part of a wafer (401) during the manufacture of the integrated circuit (404), and the wafer (401) comprised a number of dies (402) that were separated from each other by means of dicing lanes (403), and a metallization pattern (407) for forming a communication bus comprising the communication bus circuit (405) was formed in at least one of the dicing lanes (403), characterized in that the communication bus circuit (405) is designed to communicate in a wafer test mode during the manufacture and to communicate in a functional mode during normal operation.

8. An integrated circuit (1001) as claimed in claim 7, characterized in that the integrated circuit (1001) comprises a solid-state image sensor with an image pickup section (1002).

9. An integrated circuit (1001) as claimed in claim 7, characterized in that the integrated circuit (1001) comprises a CMOS image sensor.

10. An integrated circuit (404) as claimed in claim 7, characterized in that the communication bus circuit (405) is designed for communication in a serial mode.

11. An integrated circuit (404) as claimed in claim 7, characterized in that the communication bus circuit (405) is designed for communication in accordance with the $I^2C$ standard.

12. An integrated circuit (404) as claimed in claim 7, equipped with I/O terminals that are designed to establish electroconductive connections with circuits situated outside the die (402), characterized in that all I/O terminals are situated near one edge of the die (402).

13. A wafer (401) comprising dies (402), an integrated circuit (404) being realized on at least one die, and further comprising at least one dicing lane (403) that is provided with a metallization pattern (407), characterized in that the metallization pattern (407) is designed to form a communication bus comprising at least one communication bus circuit (405) that forms part of the integrated circuit (404) and that is designed so as to be able to communicate in a wafer test mode as well as in a functional test mode.

14. A wafer (401) as claimed in claim 13, characterized in that the wafer (401) is provided with separate test pads (703, 704, 802, 803) to form electroconductive contacts between the metallization pattern (407) situated in the dicing lane (403) and a wafer tester.

15. A system comprising a first integrated circuit and a second integrated circuit which are both provided with a communication bus circuit, which communication bus circuits are interconnected so as to form a communication bus, characterized in that the first integrated circuit is an integrated circuit as claimed in claim 7.

* * * * *